(12) United States Patent
Ueda

(10) Patent No.: US 10,319,616 B2
(45) Date of Patent: Jun. 11, 2019

(54) HEAT TREATMENT METHOD AND HEAT TREATMENT APPARATUS OF LIGHT IRRADIATION TYPE

(71) Applicant: SCREEN HOLDINGS CO., LTD., Kyoto (JP)

(72) Inventor: Akitsugu Ueda, Kyoto (JP)

(73) Assignee: Screen Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/907,253

(22) Filed: Feb. 27, 2018

(65) Prior Publication Data

US 2018/0261478 A1 Sep. 13, 2018

(30) Foreign Application Priority Data

Mar. 10, 2017 (JP) .................................. 2017-045975

(51) Int. Cl.
*H01L 21/67* (2006.01)
*G05D 7/06* (2006.01)
(Continued)

(52) U.S. Cl.
CPC ...... *H01L 21/67115* (2013.01); *G05D 7/0641* (2013.01); *H01L 21/2686* (2013.01);
(Continued)

(58) Field of Classification Search
CPC .............. H01L 21/2686; H01L 21/324; H01L 21/67115; H01L 21/67745; H01L 21/68735; H01L 21/6875
See application file for complete search history.

(56) References Cited

U.S. PATENT DOCUMENTS

2002/0168847 A1* 11/2002 Narwankar ............... C23C 8/02
  438/635
2003/0124873 A1* 7/2003 Xing .................... C23C 16/402
  438/770
(Continued)

FOREIGN PATENT DOCUMENTS

JP  2013-207152 A  10/2013
JP  2014-157968 A  8/2014
(Continued)

OTHER PUBLICATIONS

Taiwanese Decision to Grant a Patent issued in corresponding Taiwanese Patent Application No. 10820196550, dated Mar. 5, 2019. (No English Translation is provided since the Decision contains no comments on the reference documents.).

*Primary Examiner* — Jaehwan Oh

(74) *Attorney, Agent, or Firm* — McDermott Will & Emery LLP

(57) ABSTRACT

An untreated semiconductor wafer is transferred from an indexer unit to a treatment chamber via a first cool chamber and a transfer chamber in this order. A treated semiconductor wafer subjected to heating treatment in the treatment chamber is transferred to the indexer unit via the transfer chamber and the first cool chamber in this order. For a predetermined time after an untreated semiconductor wafer is transferred into the first cool chamber, nitrogen gas is supplied into the first cool chamber at a large supply flow rate and exhausting from the first cool chamber is performed at a large exhaust flow rate. An oxygen concentration in the first cool chamber sharply decreases to enable the semiconductor wafer after the heating treatment to be prevented from being oxidized.

8 Claims, 11 Drawing Sheets

(51) Int. Cl.
   *H01L 21/268* (2006.01)
   *H01L 21/324* (2006.01)
   *H01L 21/677* (2006.01)
   *H01L 21/687* (2006.01)

(52) U.S. Cl.
   CPC ...... *H01L 21/324* (2013.01); *H01L 21/67109* (2013.01); *H01L 21/67201* (2013.01); *H01L 21/67745* (2013.01); *H01L 21/6875* (2013.01); *H01L 21/68735* (2013.01)

(56) References Cited

U.S. PATENT DOCUMENTS

| | | |
|---|---|---|
| 2004/0126999 A1* | 7/2004 | Ramachandran ... H01L 21/2686 438/530 |
| 2007/0134821 A1* | 6/2007 | Thakur ............. C23C 16/45546 438/5 |
| 2008/0006294 A1 | 1/2008 | Saxena et al. |
| 2011/0114298 A1 | 5/2011 | Kobayashi et al. |
| 2013/0078823 A1 | 3/2013 | Takeshima et al. |
| 2013/0171348 A1 | 7/2013 | Fang et al. |
| 2014/0235072 A1 | 8/2014 | Ito |
| 2015/0294886 A1 | 10/2015 | Ravi et al. |

FOREIGN PATENT DOCUMENTS

| | | |
|---|---|---|
| TW | 201326444 A | 7/2013 |
| TW | 201330138 A | 7/2013 |
| TW | 201540860 A | 11/2015 |

\* cited by examiner

F I G. 6
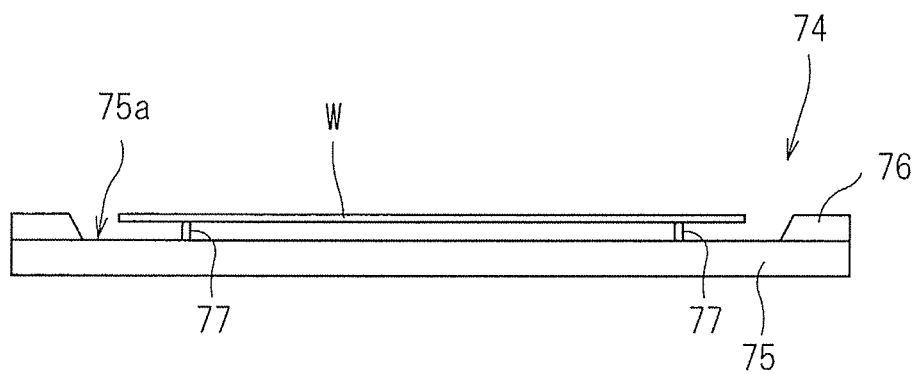

F I G . 7
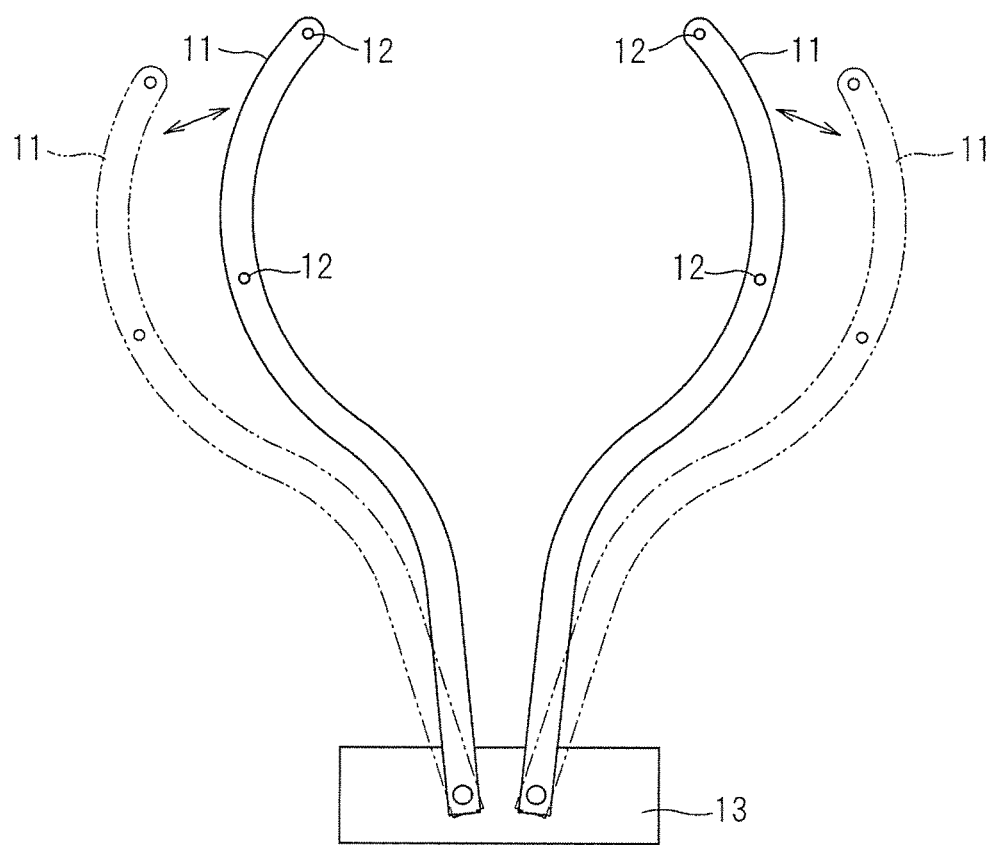

HEAT TREATMENT METHOD AND HEAT TREATMENT APPARATUS OF LIGHT IRRADIATION TYPE

BACKGROUND OF THE INVENTION

Field of the Invention

The present invention relates to a heat treatment method and a heat treatment apparatus, for irradiating a thin-plated precision electronic substrate (hereinafter referred to as simply "substrate") such as a semiconductor wafer with light to heat the substrate.

Description of the Background Art

In a manufacturing process of semiconductor devices, flash lamp annealing (FLA) for heating a semiconductor wafer for an extremely short time has been paid attention. The flash lamp annealing is a heat treatment technology for irradiating a surface of a semiconductor wafer with a flash of light by using a xenon flash lamp (hereinafter when referred to as simply a "flash lamp", it means a xenon flash lamp) to increase temperature of only the surface of the semiconductor wafer in an extremely short time (milliseconds or less).

The xenon flash lamp has an emission spectroscopy distribution radiation from an ultraviolet part to a near-infrared part, and has a wavelength that is shorter than that of a conventional halogen lamp, and that almost coincides with that of a fundamental absorption band of a semiconductor wafer made of silicon. This causes transmitted light to decrease when the xenon flash lamp irradiates a semiconductor wafer with a flash of light, so that temperature of the semiconductor wafer can be sharply increased. It is also found that emission of a flash of light for an extremely short time of milliseconds or less enables only near a surface of a semiconductor wafer to be selectively increased in temperature.

This kind of flash lamp annealing is used for treatment requiring heating for an extremely short time, such as typically activation of impurities implanted into a semiconductor wafer. When a flash lamp irradiates a surface of a semiconductor wafer, into which impurities are implanted by an ion implantation method, with a flash of light, temperature of the surface of the semiconductor wafer can be increased to an activation temperature for only an extremely short time, whereby only impurity activation can be performed without diffusing the impurities deeply.

As a heat treatment apparatus for performing flash lamp annealing, an apparatus having structure disclosed in US2014/0235072 is used, for example. The flash lamp annealing apparatus disclosed in US2014/0235072 includes a cool chamber for performing cooling treatment of a semiconductor wafer, in addition to a treatment chamber for performing annealing treatment. Typically, at the time of flash lamp annealing, a semiconductor wafer preliminary heated to several hundreds of degrees Celsius is irradiated with a flash of light to instantaneously raise temperature of a surface of the wafer to 1000° C. or higher. The semiconductor wafer heated to a high temperature as described above cannot be transferred to the outside of the apparatus, so that the semiconductor wafer after heat treatment is transferred to the cool chamber to perform the cooling treatment.

Unfortunately, even though it is instantaneous, irradiation with a flash of light may heat a surface of a semiconductor wafer to a high temperature of 1000° C. or more, so that it takes a considerably long time to cool such a high temperature semiconductor wafer. For this reason, even if the flash heating itself is completed in a short time, it takes a long time for subsequent cooling treatment. This causes a problem that cooling time becomes a rate limiting factor to reduce throughput of the whole apparatus.

Thus, it is conceivable to provide two cool chambers in the apparatus configuration disclosed in US2014/0235072 and to convey semiconductor wafers alternately to the cool chambers to suppress a decrease in throughput. However, when two cool chambers are provided, untreated semiconductor wafers prior to treatment also pass through the cool chambers. This may cause an additional problem that when a semiconductor wafer at high temperature after heating treatment is transferred to the cool chamber, the semiconductor wafer at high temperature is oxidized due to high residual oxygen concentration in the chamber.

SUMMARY OF THE INVENTION

The present invention intends for a heat treatment method for irradiating a substrate with light to heat the substrate.

In an aspect of the present invention, a heat treatment method includes the following steps of: (a) transferring an untreated substrate from an indexer unit exposed to the air atmosphere to a cooling chamber connected to the indexer unit through a first gate valve; (b) transferring out the untreated substrate from the cooling chamber to a transfer chamber connected to the cooling chamber through a second gate valve; (c) transferring the untreated substrate from the transfer chamber to a treatment chamber connected to the transfer chamber; (d) applying heating treatment to the untreated substrate in the treatment chamber; (e) transferring a treated substrate subjected to heating treatment in the treatment chamber to the cooling chamber via the transfer chamber; (f) cooling the treated substrate in the cooling chamber; and (g) transferring out the treated substrate cooled in the cooling chamber from the cooling chamber to the indexer unit, wherein nitrogen gas is supplied to the cooling chamber at a first supply flow rate or a second supply flow rate larger than the first supply flow rate, an atmosphere is exhausted from the cooling chamber at a first exhaust flow rate or a second exhaust flow rate larger than the first exhaust flow rate, and for at least a predetermined time after the untreated substrate is transferred to the cooling chamber, nitrogen gas is supplied to the cooling chamber at the second supply flow rate and exhausting from the cooling chamber is performed at the second exhaust flow rate.

Oxygen concentration in the cooling chamber sharply rising with transferring in of the untreated substrate quickly decreases to enable the substrate after the heating treatment to be prevented from being oxidized.

It is preferable that before the untreated substrate is transferred out from the cooling chamber, nitrogen gas be supplied to the cooling chamber at the first supply flow rate, and exhausting from the cooling chamber is performed at the first exhaust flow rate.

It is possible to minimize an inflow of the atmosphere from the cooling chamber to the transfer chamber when an untreated substrate is transferred out.

It is preferable that before the treated substrate is transferred out from the cooling chamber, nitrogen gas be supplied to the cooling chamber at the second supply flow rate, and exhausting from the cooling chamber is performed at the second exhaust flow rate.

It is possible to minimize an inflow of the air into the cooling chamber from the indexer unit when a treated substrate is transferred out.

The present invention also intends for a heat treatment apparatus for irradiating a substrate with light to heat the substrate.

In an aspect of the present invention, a heat treatment apparatus includes the following: an indexer unit exposed to the air atmosphere; a cooling chamber connected to the indexer unit via a first gate valve, for cooling a substrate; a transfer chamber connected to the cooling chamber via a second gate valve; a treatment chamber connected to the transfer chamber for applying heating treatment to a substrate; a gas supply unit that supplies nitrogen gas to the cooling chamber at a first supply flow rate or a second supply flow rate larger than the first supply flow rate; an exhaust unit that exhausts an atmosphere from the cooling chamber at a first exhaust flow rate or a second exhaust flow rate larger than the first exhaust flow rate; and a controller for controlling a supply flow rate by the gas supply unit and an exhaust flow rate by the exhaust unit, wherein an untreated substrate is transferred from the indexer unit to the treatment chamber via the cooling chamber and the transfer chamber in this order, a treated substrate subjected to heating treatment in the treatment chamber is transferred from the treatment chamber to the indexer unit via the transfer chamber and the cooling chamber in this order, and the controller is configured to control the gas supply unit and the exhaust unit so as to supply nitrogen gas to the cooling chamber at the second supply flow rate and to perform exhausting from the cooling chamber at the second exhaust flow rate, respectively, for at least a predetermined time after the untreated substrate is transferred to the cooling chamber.

Oxygen concentration in the cooling chamber sharply rising with transferring in of the untreated substrate quickly decreases to enable the substrate after the heating treatment to be prevented from being oxidized.

It is preferable that the controller is configured to control the gas supply unit and the exhaust unit so as to supply nitrogen gas to the cooling chamber at the first supply flow rate and to perform exhausting from the cooling chamber at the first exhaust flow rate, respectively, before the untreated substrate is transferred out from the cooling chamber.

It is possible to minimize an inflow of the atmosphere from the cooling chamber to the transfer chamber when an untreated substrate is transferred out.

It is preferable that the controller be configured to control the gas supply unit and the exhaust unit so as to supply nitrogen gas to the cooling chamber at the second supply flow rate and to perform exhausting from the cooling chamber at the second exhaust flow rate, respectively, before the treated substrate is transferred out from the cooling chamber.

It is possible to minimize an inflow of the air into the cooling chamber from the indexer unit when a treated substrate is transferred out.

Thus, it is an object of the present invention to prevent oxidation of a substrate after heating treatment.

These and other objects, features, aspects and advantages of the present invention will become more apparent from the following detailed description of the present invention when taken in conjunction with the accompanying drawings.

BRIEF DESCRIPTION OF THE DRAWING

FIG. 6 is a sectional view of the susceptor;

FIG. 7 is a plan view of a transfer mechanism;

DESCRIPTION OF THE PREFERRED EMBODIMENTS

Hereinafter, preferred embodiments of the present invention will be described in detail with reference to drawings.

Figure 1:
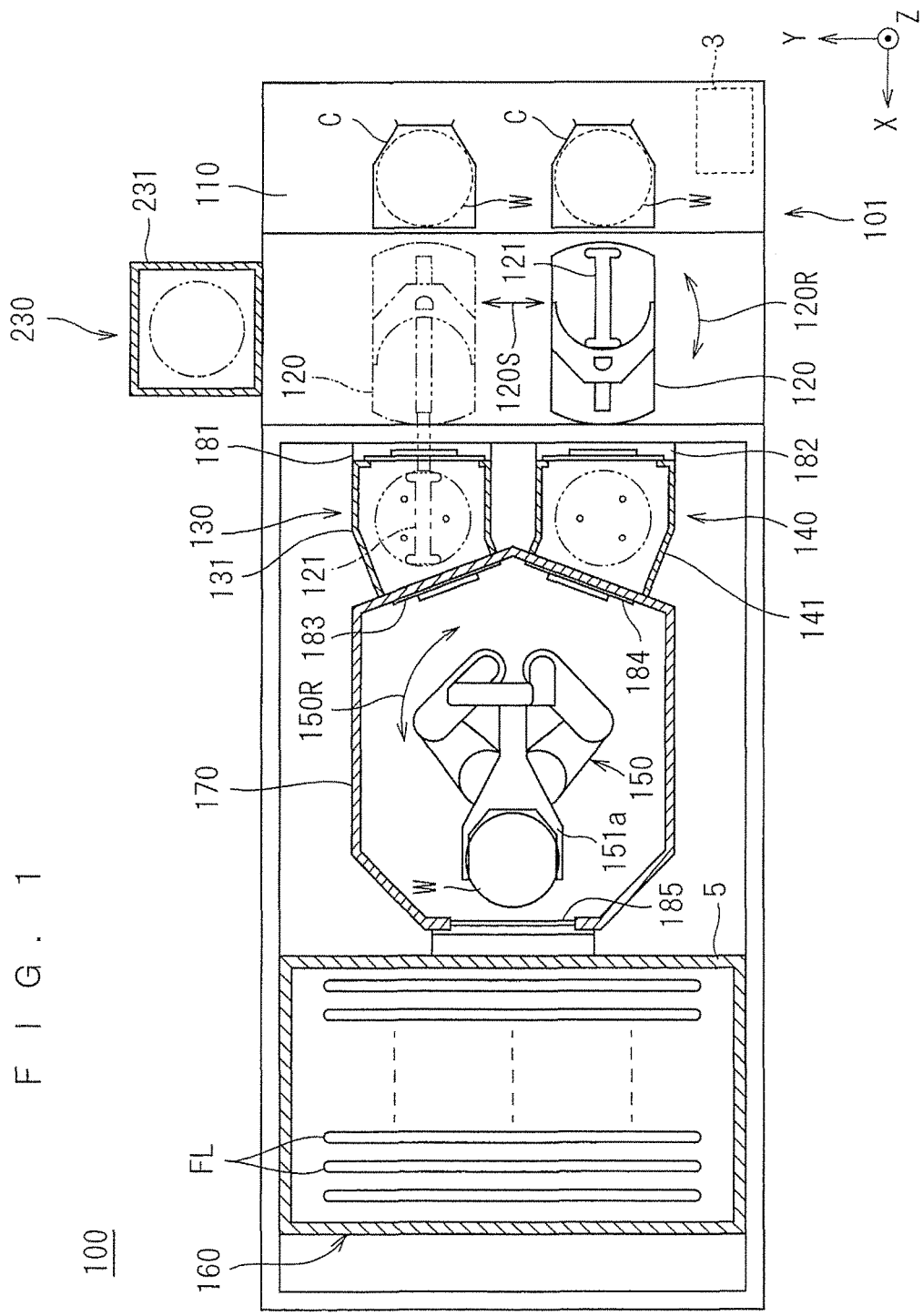
FIG. 1 is a plan view showing a heat treatment apparatus according to the present invention.
Figure 2:
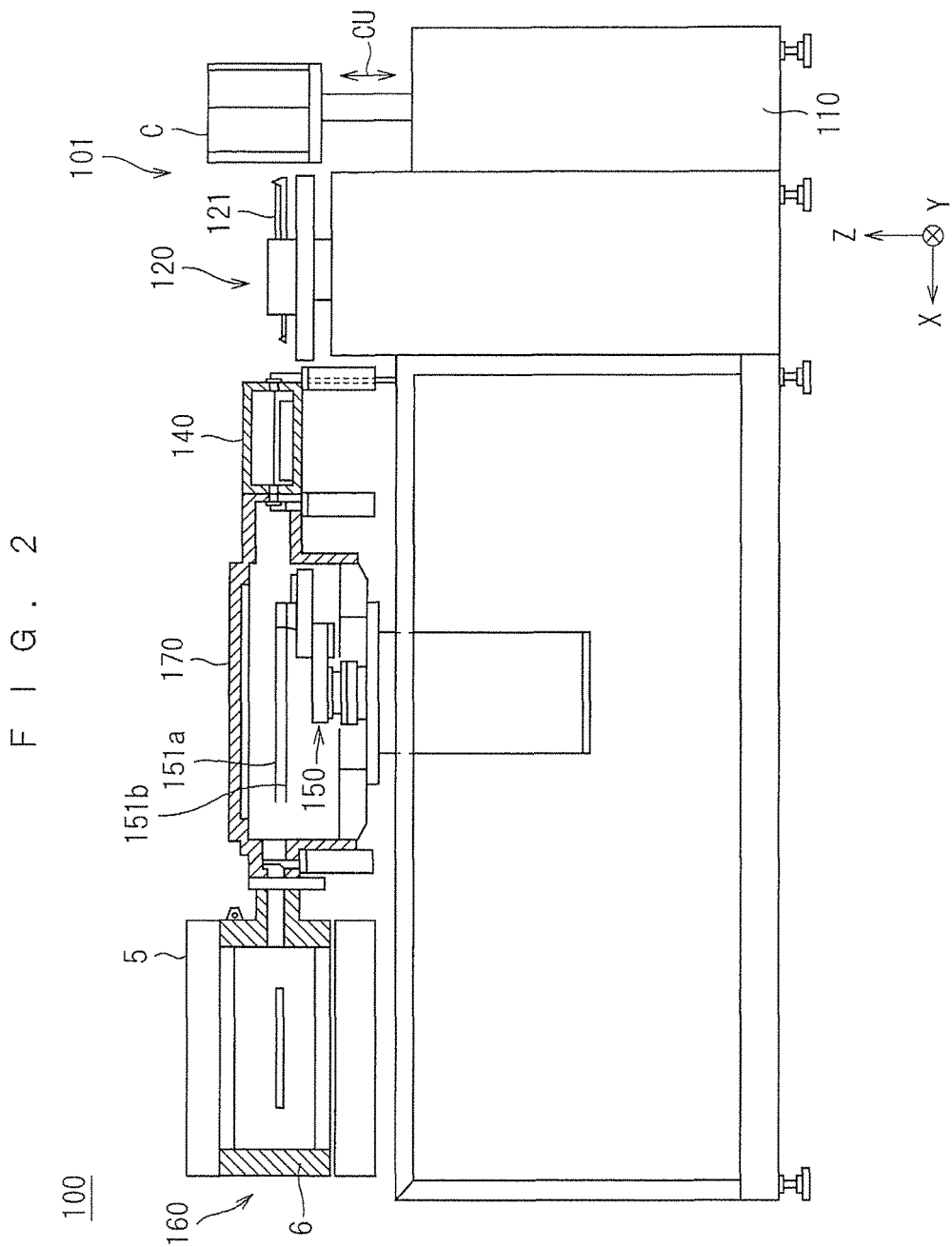
FIG. 2 is a front view of the heat treatment apparatus of FIG. 1.

First, a general schematic configuration of a heat treatment apparatus 100 according to the present invention will be described. FIG. 1 is a plan view showing the heat treatment apparatus 100 according to the present invention, and FIG. 2 is a front view thereof. The heat treatment apparatus 100 is a flash lamp annealing apparatus that irradiates a semiconductor wafer W in the shape of a disk, as a substrate, with a flash of light to heat the semiconductor wafer W. Although a size of the semiconductor wafer W to be treated is not particularly limited, the semiconductor wafer W to be treated has a diameter of 300 mm or 450 mm, for example. Impurities are implanted into a semiconductor wafer W before being transferred in the heat treatment apparatus 100, and activation treatment for the implanted impurities is performed by heating treatment by the heat treatment apparatus 100. It should be noted that the dimensions of components and the number of components are shown in exaggeration or in simplified manner, as appropriate, in FIG. 1 and the subsequent figures for the sake of easier understanding. In addition, an XYZ orthogonal coordinate system having a Z-axis direction as a vertical direction and an XY plane as a horizontal plane is given in each of FIGS. 1 to 3 to clarify a directional relationship among the drawings.

As shown in FIGS. 1 and 2, the heat treatment apparatus 100 includes: an indexer unit 101 for transferring an untreated semiconductor wafer W into the apparatus from the outside, and for transferring out a treated semiconductor wafer W from the apparatus; an alignment unit 230 for positioning an untreated semiconductor wafer W; two cooling units 130 and 140 for cooling the semiconductor wafer W after heating treatment; a heat treatment unit 160 for applying flash heating treatment to the semiconductor wafer W; and a transfer robot 150 for performing a delivery of a semiconductor wafer W for the cooling units 130 and 140, and the heat treatment unit 160. The heat treatment apparatus 100 further includes a controller 3 that controls an operation mechanism provided in each of the treatment units, and the transfer robot 150, to proceed the flash heating treatment of the semiconductor wafer W.

The indexer unit 101 includes a load port 110 for placing a plurality of carriers C (two in the present preferred embodiment) side by side, and a delivery robot 120 that takes out an untreated semiconductor wafer W from each of the carriers C, and that houses a treated semiconductor wafer W in each of the carriers C. The carrier C accommodating an untreated semiconductor wafer W is transferred by an automatic guided vehicle (AGV, OHT) or the like, and is placed on the load port 110. The carrier C accommodating a treated semiconductor wafer W is transferred out from the load port 110 by an automatic guided vehicle.

In the load port 110, the carrier C is configured to be able to move up and down as indicated by arrow CU in FIG. 2 so that the delivery robot 120 can take in and out an arbitrary semiconductor wafer W for the carrier C. As a form of the carrier C, a standard mechanical inter face (SMIF) pod, and an open cassette (OC) exposing a housed semiconductor wafer W to the outside air, may be used in addition to a front opening unified pod (FOUP) that houses the semiconductor wafer W in an enclosed space.

In addition, the delivery robot 120 can perform a sliding movement as indicated by arrow 120S in FIG. 1, a turning operation as shown by arrow 120R, and a lifting operation. As a result, the delivery robot 120 takes in and out a semiconductor wafer W to and from the two carriers C, and delivers the semiconductor wafer W to the alignment unit 230, and the two cooling units 130 and 140. The delivery robot 120 takes in and out a semiconductor wafer W for the carrier C with sliding movement of the hand 121 and lifting movement of the carrier C. A semiconductor wafer W is delivered between the delivery robot 120 and the alignment unit 230 or the cooling units 130 and 140 with sliding movement of the hand 121 and lifting operation of the delivery robot 120.

The alignment unit 230 is provided laterally to the indexer unit 101 along a Y-axis direction. The alignment unit 230 is a treatment unit that rotates a semiconductor wafer W in a horizontal plane to allow it to face a direction suitable for flash heating. The alignment unit 230 includes a mechanism for rotating a semiconductor wafer W while supporting it in a horizontal attitude and a mechanism for optically detecting a notch, an orientation flat, and the like, formed in a peripheral portion of the semiconductor wafer W in an alignment chamber 231 being an enclosure made of an aluminum alloy.

The delivery robot 120 delivers a semiconductor wafer W to the alignment unit 230. The delivery robot 120 delivers a semiconductor wafer W to the alignment chamber 231 such that the wafer center is positioned at a predetermined position. The alignment unit 230 rotates a semiconductor wafer W received from the indexer unit 101 around a vertical axis by centering a central portion of the semiconductor wafer W, and optically detects a notch or the like to adjust an orientation of the semiconductor wafer W. The semiconductor wafer W whose orientation has been adjusted is taken out from the alignment chamber 231 by the delivery robot 120.

A transfer chamber 170 for accommodating the transfer robot 150 is provided as a transfer space for a semiconductor wafer W transferred by the transfer robot 150. A treatment chamber 6 of the heat treatment unit 160, a first cool chamber 131 of the cooling unit 130, and a second cool chamber 141 of the cooling unit 140, are connected in communication with three respective sides of the transfer chamber 170.

The heat treatment unit 160, which is a main part of the heat treatment apparatus 100, is a substrate treatment unit that performs a flash heating treatment by irradiating a preliminary heated semiconductor wafer W with a flash of light from a xenon flash lamp FL. A structure of the heat treatment unit 160 will be described in detail later.

Figure 10:
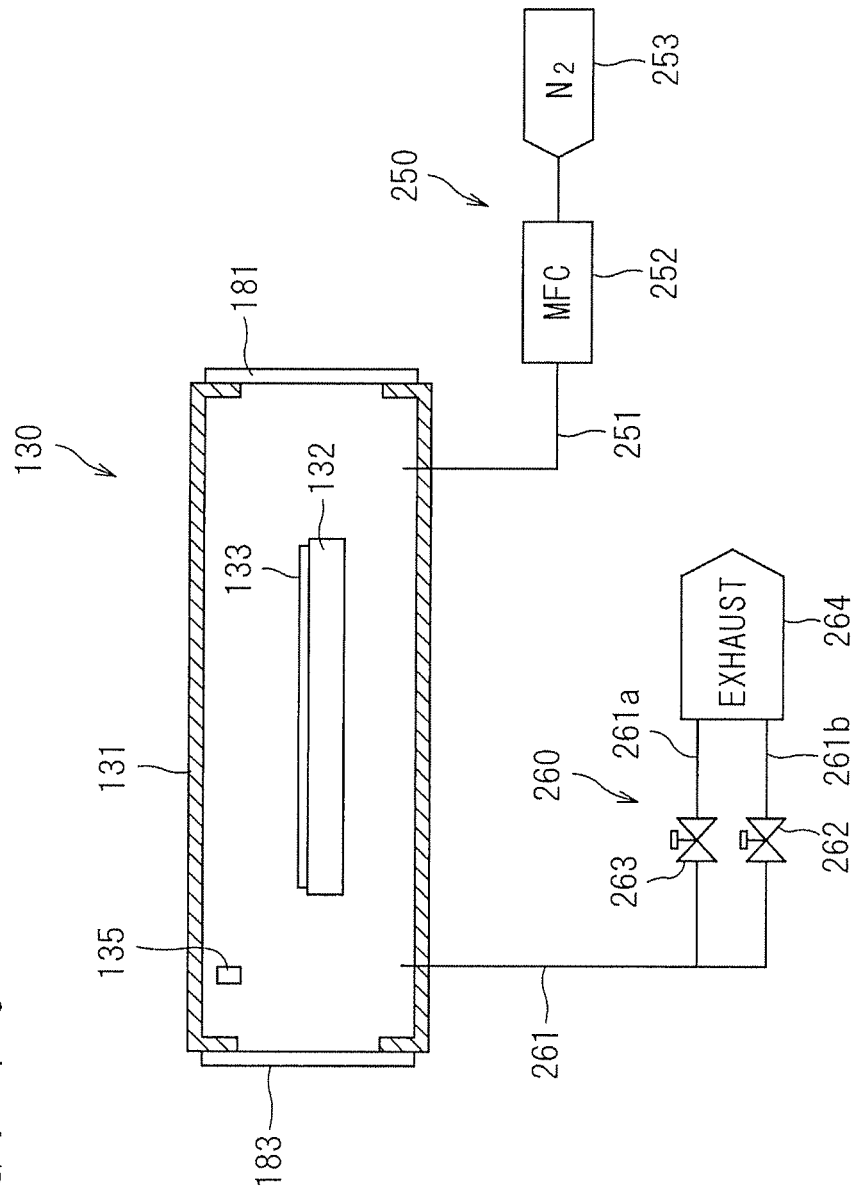
FIG. 10 is a diagram showing a configuration of a cooling unit.

The two cooling units 130 and 140 each have almost the same configuration. FIG. 10 is a diagram showing the configuration of the cooling unit 130. The cooling unit 130 includes a cooling plate 132 made of metal inside a first cool chamber 131 that is an enclosure made of an aluminum alloy. A quartz plate 133 is placed on an upper surface of the cooling plate 132. The cooling plate 132 is temperature-controlled at room temperature (about 23° C.) by a Peltier element or constant temperature water circulation. When a semiconductor wafer W subjected to the flash heating treatment in the heat treatment unit 160 is transferred to the first cool chamber 131, the semiconductor wafer W is placed on the quartz plate 133 and cooled. The first cool chamber 131 is provided therein with an oxygen concentration meter 135 for measuring an oxygen concentration in an internal space thereof.

The first cool chamber 131 is provided with two openings for transferring in and out a semiconductor wafer W. One of the two openings, connected to the indexer unit 101, is openable and closable by a gate valve 181. Meanwhile, the other opening connected to the transfer chamber 170 is openable and closable by a gate valve 183. That is, the first cool chamber 131 and the indexer unit 101 are connected to each other via the gate valve 181, and the first cool chamber 131 and the transfer chamber 170 are connected to each other via the gate valve 183.

When a semiconductor wafer W is delivered between the indexer unit 101 and the first cool chamber 131, the gate valve 181 is opened. When a semiconductor wafer W is delivered between the first cool chamber 131 and the transfer chamber 170, the gate valve 183 is opened. The gate valve 181 and the gate valve 183 are closed to cause the inside of the first cool chamber 131 to be an enclosed space.

The cooling unit 130 includes a gas supply unit 250 that supplies nitrogen gas ($N_2$) to the first cool chamber 131, and an exhaust unit 260 that exhausts air from the first cool chamber 131. The gas supply unit 250 includes a supply pipe 251, a mass flow controller 252, and a nitrogen gas supply source 253. The supply pipe 251 is connected at its distal end to the first cool chamber 131, and is connected at its base end to the nitrogen gas supply source 253. The mass flow controller 252 is provided in a path of the supply pipe 251. The mass flow controller 252 can adjust a flow rate of nitrogen gas supplied to the first cool chamber 131 from the nitrogen gas supply source 253, and switches between a large supply flow rate (e.g., 120 liters/minute) and a small supply flow rate (e.g., 20 liters/minute) in the present preferred embodiment. That is, the gas supply unit 250 supplies nitrogen gas to the first cool chamber 131 at the large supply flow rate or the small supply flow rate.

The exhaust unit 260 includes an exhaust pipe 261, a main valve 263, an auxiliary valve 262, and an exhaust mechanism 264. The exhaust pipe 261 is connected at its distal end to the first cool chamber 131, and is connected at its base end to the exhaust mechanism 264. The exhaust pipe 261 is bifurcated into a main exhaust pipe 261a and an auxiliary exhaust pipe 261b on its base end side, and each of the main exhaust pipe 261a and the auxiliary exhaust pipe 261b is connected to the exhaust mechanism 264. The main valve 263 is provided in a path of the main exhaust pipe 261a, and the auxiliary valve 262 is provided in a path of the auxiliary exhaust pipe 261b.

The main exhaust pipe 261a and the auxiliary exhaust pipe 261b each have a different pipe diameter. The main exhaust pipe 261a has a pipe diameter larger than a pipe diameter of the auxiliary exhaust pipe 261b. That is, an exhaust path using the main exhaust pipe 261a and an exhaust path using the auxiliary exhaust pipe 261*b* are different from each other in exhaust conductance. In the present preferred embodiment, while the auxiliary valve 262 is normally opened, opening and closing of the main valve 263 is appropriately switched. When both the main valve 263 and the auxiliary valve 262 are open, the atmosphere in the first cool chamber 131 is exhausted at the large exhaust flow rate. On the other hand, when the main valve 263 is closed and only the auxiliary valve 262 is opened, the atmosphere in the first cool chamber 131 is exhausted at the small exhaust flow rate. That is, the exhaust unit 260 exhausts the atmosphere from the first cool chamber 131 at the large exhaust flow rate or the small exhaust flow rate. The nitrogen gas supply source 253 and the exhaust mechanism 264 each may be a mechanism provided in the heat treatment apparatus 100, or a utility system of a factory in which the heat treatment apparatus 100 is installed.

The cooling unit 140 also has substantially the same configuration as the cooling unit 130. That is, the cooling unit 140 includes the second cool chamber 141 being an enclosure made of an aluminum alloy, inside which a cooling plate made of metal and a quartz plate placed on an upper surface of the cooling plate are provided. The second cool chamber 141 and the indexer unit 101 are connected to each other via a gate valve 182, and the second cool chamber 141 and the transfer chamber 170 are connected to each other via a gate valve 184 (with reference to FIG. 1). The cooling unit 140 also has a supply and exhaust mechanism similar to the gas supply unit 250 and the exhaust unit 260 described above.

The transfer robot 150 provided in the transfer chamber 170 can be turned as indicated by arrow 150R about an axis along the vertical direction. The transfer robot 150 has two link mechanisms each composed of a plurality of arm segments, and the two link mechanisms each are provided at its distal end with the corresponding one of transfer hands 151*a* and 151*b* each of which holds a semiconductor wafers W. These transfer hands 151*a* and 151*b* are disposed vertically apart from each other by a predetermined interval, and are independently linearly slidable in the same horizontal direction by the link mechanisms. The transfer robot 150 moves up and down a base provided with the two link mechanisms to move up and down the two transfer hands 151*a* and 151*b* while being apart from each other by the predetermined interval.

When the transfer robot 150 delivers (takes in and out) a semiconductor wafer W to the first cool chamber 131, the second cool chamber 141, or the treatment chamber 6 of the heat treatment unit 160, as a delivery partner, both the transfer hands 151*a* and 151*b* are first turned so as to face the delivery partner, and then (or while being turned) are moved up and down so that any one of the transfer hands is positioned at a height at which the semiconductor wafer W is delivered to and received from the delivery partner. Then, the transfer hand 151*a* (151*b*) is linearly slid in the horizontal direction to deliver the semiconductor wafer W to the delivery partner.

The delivery of the semiconductor wafer W between the transfer robot 150 and the delivery robot 120 is performed via the cooling units 130 and 140. That is, the two cooling units 130 and 140 each also serve as a path for delivering the semiconductor wafer W between the transfer robot 150 and the delivery robot 120. Specifically, a delivery of a semiconductor wafer W is performed as follows: one of the transfer robot 150 and the delivery robot 120 delivers a semiconductor wafer W to the first cool chamber 131 or the second cool chamber 141, and the other thereof receives the semiconductor wafer W.

As described above, the gate valves 181 and 182 are provided between the first cool chamber 131 and the indexer unit 101, and between the second cool chamber 141 and the indexer unit 101, respectively. The gate valves 183 and 184 are provided between the transfer chamber 170 and the first cool chamber 131, and between the transfer chamber 170 and the second cool chamber 141, respectively. In addition, a gate valve 185 is provided between the transfer chamber 170 and the treatment chamber 6 of the heat treatment unit 160. When a semiconductor wafer W is transferred in the heat treatment apparatus 100, these gate valves are appropriately opened and closed.

Nitrogen gas is also supplied to the transfer chamber 170 and the alignment chamber 231 from a gas supply unit (not shown), and the atmosphere inside them is exhausted by an exhaust unit (not shown).

Figure 3:
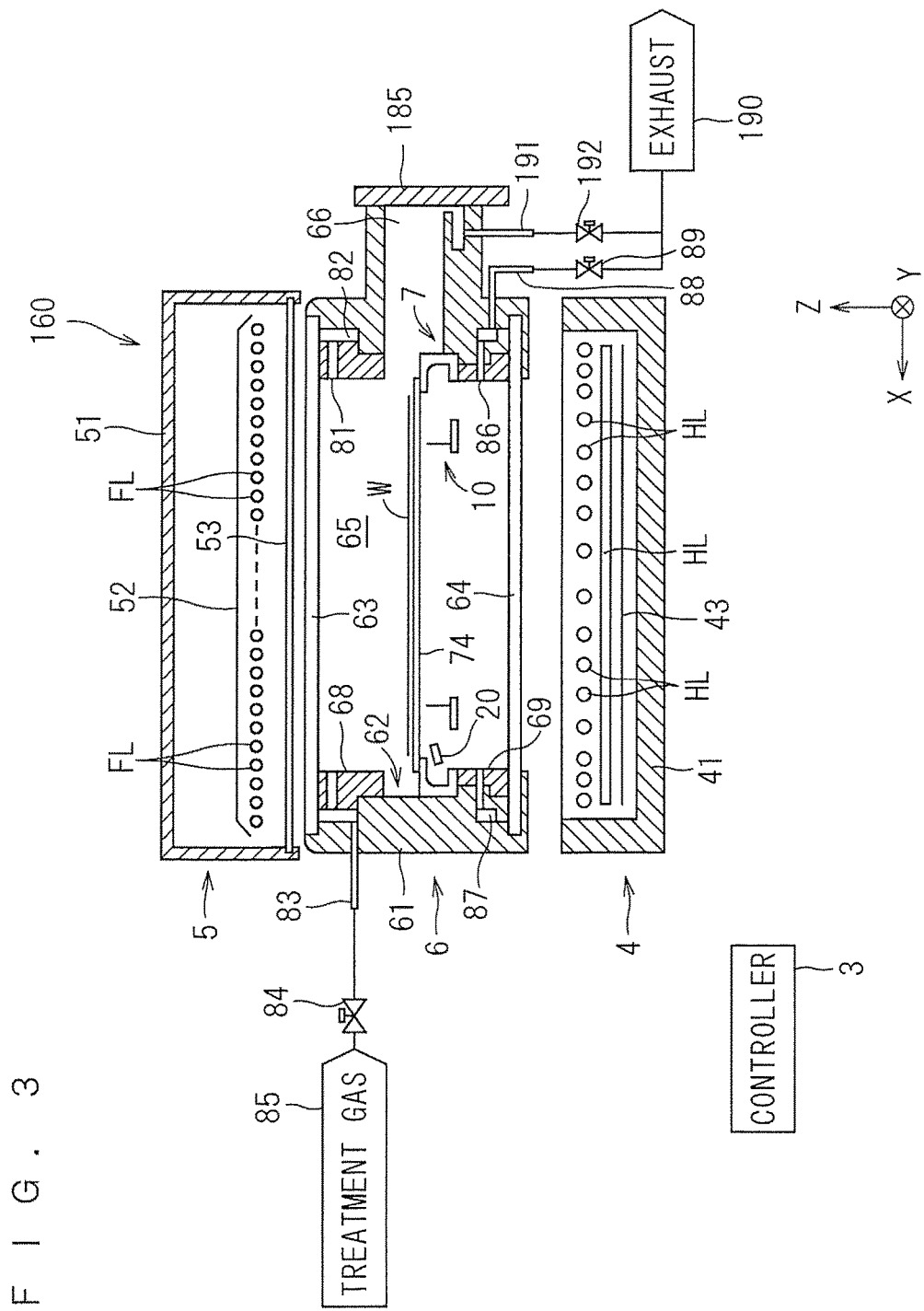
FIG. 3 is a longitudinal sectional view showing a structure of a heat treatment unit.

Next, a structure of the heat treatment unit 160 will be described. FIG. 3 is a longitudinal sectional view showing a structure of the heat treatment unit 160. The heat treatment unit 160 includes a treatment chamber 6 for accommodating a semiconductor wafer W and performing heat treatment, a flash lamp house 5 having a plurality of built-in flash lamps FL, and a halogen lamp house 4 having a plurality of built-in halogen lamps HL. The flash lamp house 5 is provided over the treatment chamber 6, and the halogen lamp house 4 is provided under the treatment chamber 6. The heat treatment unit 160 further includes inside the treatment chamber 6 a holder 7 for holding a semiconductor wafer W in a horizontal attitude, and a transfer mechanism 10 for delivering a semiconductor wafer W between the holder 7 and the transfer robot 150.

The treatment chamber 6 includes a tubular chamber side portion 61, and chamber windows made of quartz mounted on the top and bottom of the chamber side portion 61. The chamber side portion 61 has a substantially tubular shape with an open top and an open bottom. An upper chamber window 63 is mounted to block the open top of the chamber side portion 61, and a lower chamber window 64 is mounted to block the open bottom thereof. The upper chamber window 63 forming the ceiling of the chamber 6 is a disk-shaped member made of quartz, and serves as a quartz window that transmits flashes of light emitted from the flash lamps FL therethrough into the chamber 6. The lower chamber window 64 forming the floor of the chamber 6 is also a disk-shaped member made of quartz, and serves as a quartz window that transmits light emitted from the halogen lamps HL therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. Meanwhile, the lower reflective ring 69 is mounted by being inserted upwardly from the bottom of the chamber side portion 61, and is fastened with screws (not shown). In other words, the upper and lower reflective rings 68 and 69 are detachably mounted to the chamber side portion 61. An interior space of the treatment chamber 6, or a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the treatment chamber 6 by mounting the upper and lower reflective rings 68 and 69 to the chamber side portion 61. Specifically, there is defined the recessed portion 62 surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the treatment chamber 6, and surrounds the holder 7 that holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transfer of a semiconductor wafer W therethrough into and out of the treatment chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transferred through the transport opening 66 and the recessed portion 62 into and out of the heat treatment space 65. When the transport opening 66 is closed by the gate valve 185, the heat treatment space 65 in the treatment chamber 6 is an enclosed space.

At least one gas supply opening 81 for supplying a treatment gas therethrough into the heat treatment space 65 is provided in an upper portion of the inner wall of the treatment chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the treatment chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing into the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), and reactive gases such as hydrogen ($H_2$) and ammonia ($NH_3$) (nitrogen gas is used in the present preferred embodiment).

At least one gas exhaust opening 86 for exhausting a gas from the heat treatment space 65 is provided in a lower portion of the inner wall of the treatment chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the treatment chamber 6. The gas exhaust pipe 88 is connected to an exhaust mechanism 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the treatment chamber 6, and each may be in the form of a slit. The treatment gas supply source 85 and the exhaust mechanism 190 each may be a mechanism provided in the heat treatment apparatus 100, or a utility system of a factory in which the heat treatment apparatus 100 is installed.

A gas exhaust pipe 191 for exhausting the gas from the heat treatment space 65 is also connected to a distal end of the transport opening 66. The gas exhaust pipe 191 is connected through a valve 192 to the exhaust mechanism 190. By opening the valve 192, the gas in the treatment chamber 6 is exhausted through the transport opening 66.

Figure 4:
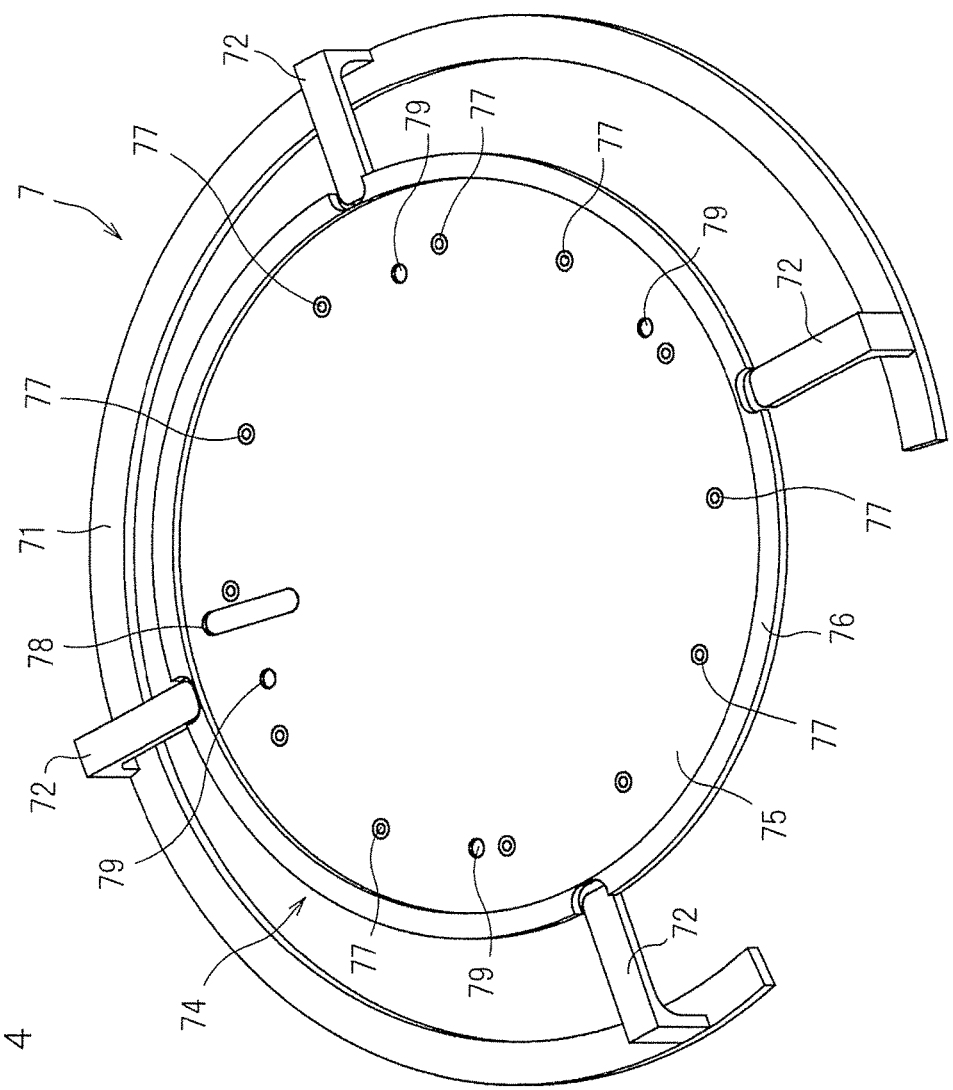
FIG. 4 is a perspective view showing an overall appearance of a holder.

FIG. 4 is a perspective view showing an entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the treatment chamber 6 by being placed on the bottom surface of the recessed portion 62 (with reference to FIG. 3). The multiple coupling portions 72 (in the present preferred embodiment, four coupling portions 72) are mounted upright on the upper surface of the base ring 71 and arranged in a circumferential direction of the annular shape thereof. The coupling portions 72 are also quartz members, and are rigidly secured to the base ring 71 by welding.

Figure 5:
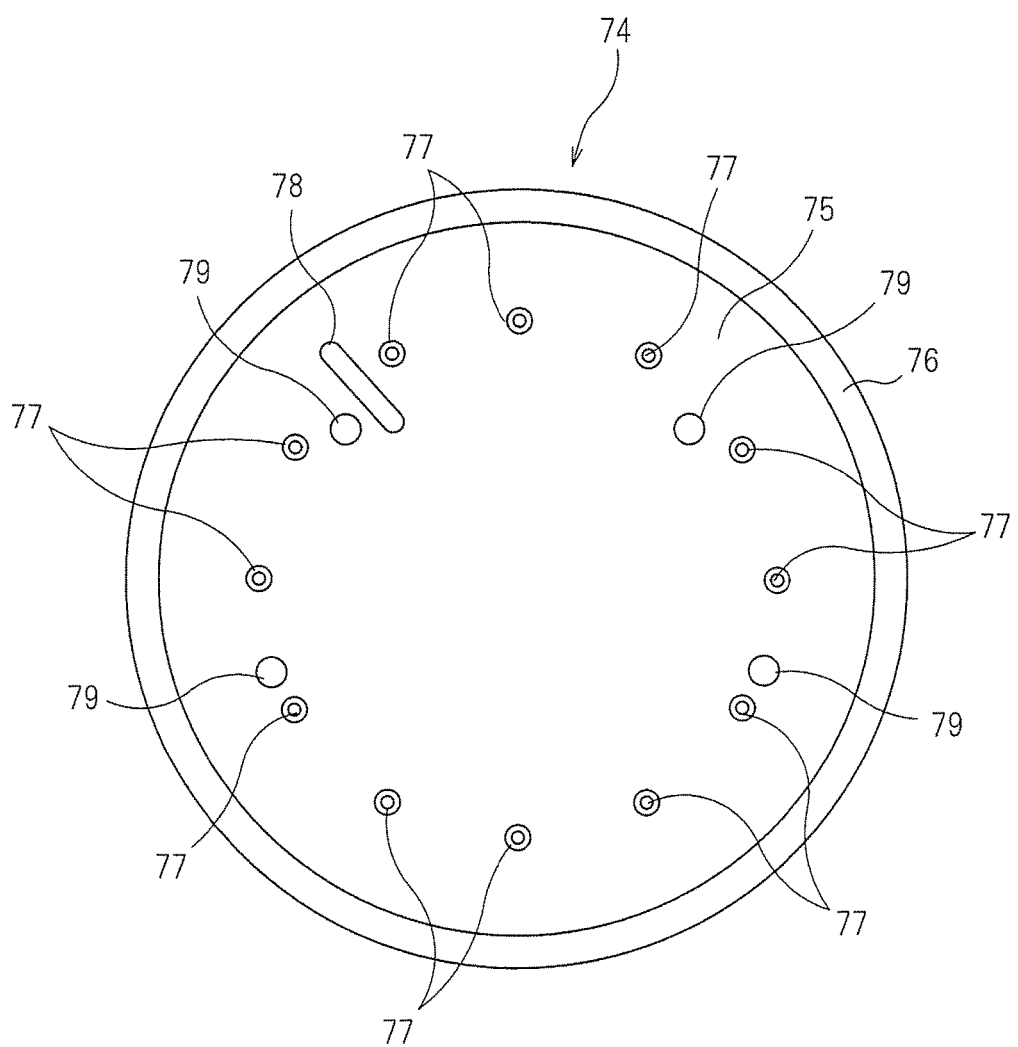
FIG. 5 is a plan view of a susceptor.

The susceptor 74 is supported by the four coupling portions 72 provided on the base ring 71. FIG. 5 is a plan view of the susceptor 74. FIG. 6 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface that becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pills 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 mm to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 4, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the treatment chamber 6, whereby the holder 7 is mounted to the chamber 6. With the holder 7 mounted to the treatment chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal plane.

A semiconductor wafer W transferred into the treatment chamber 6 is placed and held in a horizontal attitude on the susceptor 74 of the holder 7 mounted to the treatment chamber 6. At this time, the semiconductor wafer W is supported by the 12 substrate support pins 77 provided upright on the holding plate 75, and is held by the susceptor 74. More strictly speaking, the respective upper ends of the 12 substrate support pins 77 come in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper end of the substrate support pin 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 4 and 5, an opening 78 is provided in the holding plate 75 of the susceptor 74 so as to extend vertically through the holding plate 75 of the susceptor 74. The opening 78 is provided for a radiation thermometer 20 (with reference to FIG. 3) to receive radiation (infrared radiation) emitted from the lower surface of the semiconductor wafer W held by the susceptor 74. Specifically, the radiation thermometer 20 receives the radiation emitted from the lower surface of the semiconductor wafer W held by the susceptor 74 through the opening 78, and a separately placed detector measures the temperature of the semiconductor wafer W. Further, the holding plate 75 of the susceptor 74 further includes four through holes 79 bored therein and designed so that lift pins 12 of the transfer mechanism 10 to be described later pass through the respective through holes 79, respectively, to transfer a semiconductor wafer W.

Figure 8:
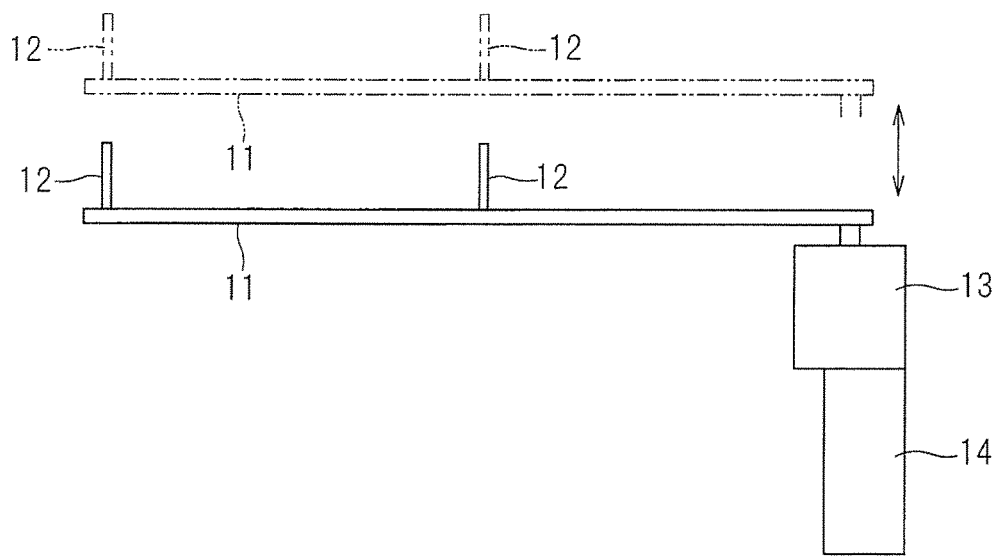
FIG. 8 is a side view of the transfer mechanism.

FIG. 7 is a plan view of the transfer mechanism 10. FIG. 8 is a side view of the transfer mechanism 10. The transfer mechanism 10 includes two transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 7) in which a semiconductor wafer W is transferred to and from the holder 7, and a retracted position (a position indicated by dash-double-dot lines in FIG. 7) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The pair of transfer arms 11 is moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 4 and 5) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism (not shown) is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the treatment chamber 6.

Referring again to FIG. 3, the flash lamp house 5 provided over the treatment chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash lamp house 5 includes a lamp light radiation window 53 mounted to the bottom of the enclosure 51. The lamp light radiation window 53 forming the floor of the flash lamp house 5 is a plate-like quartz window made of quartz. The flash lamp house 5 is provided over the treatment chamber 6, whereby the lamp light radiation window 53 is opposed to the upper chamber window 63. The flash lamps FL direct flashes of light from over the treatment chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

The xenon flash lamp FL includes a rod-shaped glass tube (discharge tube) containing xenon gas sealed therein and having positive and negative electrodes provided on opposite ends thereof, the electrodes being connected to a capacitor, and a trigger electrode attached to the outer peripheral surface of the glass tube. A xenon gas is electrically insulated, so that no electricity flows in the glass tube in a normal state even if electric charges are accumulated in the capacitor. However, when high voltage is applied to the trigger electrode to produce an electrical breakdown, electricity accumulated in the capacitor flows momentarily in the glass tube, and then xenon atoms or molecules are excited to cause light emission. In the xenon flash lamp FL as described above, electrostatic energy preliminarily accumulated in the capacitor is converted into an extremely short optical pulse of 0.1 milliseconds to 100 milliseconds, so that it has a feature capable of emitting extremely intensive light as compared with a light source of continuous lighting like the halogen lamp HL. That is, the flash lamp FL is a pulse emission lamp that instantaneously emits light in an extremely short time of less than one second. The flash lamp FL has a light emission time that can be adjusted by changing a coil constant of a lamp power source that supplies electric power to the flash lamp FL.

The reflector 52 is provided over the plurality of flash lamps FL so as to cover all of the flash lamps FL. The reflector 52 has a fundamental function of reflecting flashes of light emitted from the plurality of flash lamps FL toward the heat treatment space 65. The reflector 52 is a plate made of an aluminum alloy, and has a surface (a surface facing the flash lamps FL) that is roughened by abrasive blasting.

The halogen lamp house 4 provided under the treatment chamber 6 includes an enclosure 41 incorporating the multiple (in the present preferred embodiment, 40) halogen lamps HL. The plurality of halogen lamps HL irradiates the heat treatment space 65 with light from under the treatment chamber 6 through the lower chamber window 64.

Figure 9:
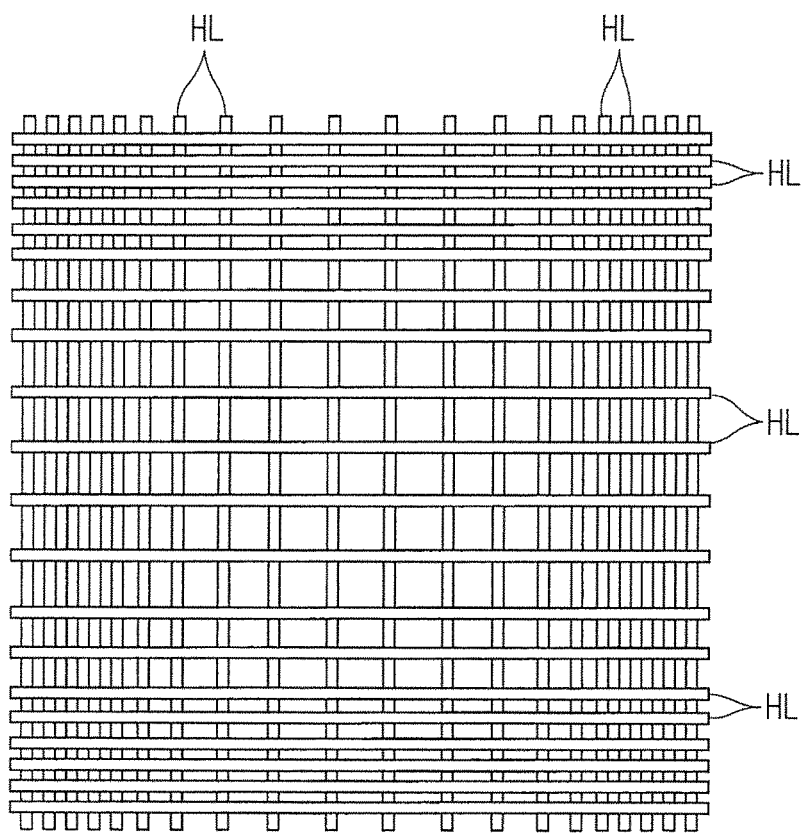
FIG. 9 is a plan view showing a placement of a plurality of halogen lamps.

FIG. 9 is a plan view showing a placement of the multiple halogen lamps HL. In the present preferred embodiment, 20 halogen lamps HL are arranged in each of upper and lower tiers. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 9, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen lamps HL.

The group of halogen lamps HL in the upper tier and the group of halogen lamps HL in the lower tier are arranged to intersect each other in a lattice pattern. In other words, the 40 halogen lamps HL in total are disposed such that the longitudinal direction of each of the halogen lamps HL arranged in the upper tier and the longitudinal direction of each of the halogen lamps HL arranged in the lower tier are orthogonal to each other.

Each of the halogen lamps HL is a filament-type light source that passes current through a filament disposed in a glass tube to make the filament incandescent, thereby emitting light. A gas prepared by introducing a halogen element (iodine, bromine, and the like) in trace amounts into an inert gas such as nitrogen, argon, and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamp HL is a continuous lighting lamp that continuously emits light for not less than one second. In addition, the halogen lamps HL, which are rod-shaped lamps, have a long life. The arrangement of the halogen lamps HL in a horizontal direction provides good efficiency of radiation toward a semiconductor wafer W provided over the halogen lamps HL.

A reflector 43 is provided also inside the enclosure 41 of the halogen lamp house 4 under the halogen lamps HL arranged in two tiers (with reference to FIG. 3). The reflector 43 reflects light emitted from the halogen lamps HL toward the heat treatment space 65.

The heat treatment unit 160 further includes, in addition to the aforementioned components, various cooling structures to prevent an excessive temperature rise in the halogen lamp house 4, the flash lamp house 5, and the treatment chamber 6 because of the heat energy generated from the halogen lamps HL and the flash lamps FL during the heat treatment of a semiconductor wafer W. As an example, a water cooling tube (not shown) is provided in the walls of the treatment chamber 6. In addition, the halogen lamp house 4 and the flash lamp house 5 each have an air cooling structure for forming a gas flow therein to exhaust heat. Air is supplied to a gap between the upper chamber window 63 and the lamp light radiation window 53 to cool down the flash lamp house 5 and the upper chamber window 63.

The controller 3 controls the aforementioned various operating mechanisms provided in the heat treatment apparatus 100. The controller 3 is similar in hardware configuration to a typical computer. Specifically, the controller 3 includes a CPU that is a circuit for performing various computation processes, a ROM or read-only memory for storing a basic program therein, a RAM or readable-writable memory for storing various pieces of information therein, and a magnetic disk for storing control software, data, and the like therein. The CPU in the controller 3 executes a predetermined processing program, whereby the processes in the heat treatment apparatus 100 proceed. While the controller 3 is provided in the indexer unit 101 in FIG. 1, the controller 3 is not limited thereto, and the controller 3 can be disposed at an arbitrary position in the heat treatment apparatus 100.

Next, treatment operation for a semiconductor wafer W by the heat treatment apparatus 100 according to the present invention will be described. The semiconductor wafer W to be treated is a semiconductor substrate into which impurities (ions) are added by an ion implantation method. The impurities are activated by heating treatment (annealing) by irradiation with a flash of light, performed by the heat treatment apparatus 100. Here, an approximate transfer procedure of the semiconductor wafer W in the heat treatment apparatus 100 and the heating treatment of a semiconductor wafer W in the heat treatment unit 160 will be described.

First, an untreated semiconductor wafer W into which impurities are implanted is placed on the load port 110 of the indexer unit 101 in a state where a plurality of semiconductor wafers W is accommodated in the carrier C. Then, the delivery robot 120 takes out an untreated semiconductor wafer W one by one from the carrier C, and transfers it into the alignment chamber 231 of the alignment unit 230. In the alignment chamber 231, a semiconductor wafer W is rotated around a vertical axis in a horizontal plane by centering a central portion of the semiconductor wafer W, and optically detects a notch or the like to adjust an orientation of the semiconductor wafer W.

Next, the delivery robot 120 of the indexer unit 101 takes out the semiconductor wafer W with an adjusted orientation from the alignment chamber 231, and transfers it into the first cool chamber 131 of the cooling unit 130 or the second cool chamber 141 of the cooling unit 140. The untreated semiconductor wafer W transferred into the first cool chamber 131 or the second cool chamber 141 is transferred out to the transfer chamber 170 by the upper transfer hand 151*a* of the transfer robot 150. When the untreated semiconductor wafer W is transferred from the indexer unit 101 to the transfer chamber 170 via the first cool chamber 131 or the second cool chamber 141, the first cool chamber 131 and the second cool chamber 141 each serve as a path for a delivery of a semiconductor wafer W. While an atmosphere in the first cool chamber 131 or the second cool chamber 141, in which the semiconductor wafer W has been transferred, is controlled in accordance with timing of transfer of a semiconductor wafer W, details thereof will be described later.

The transfer robot 150 taking out the semiconductor wafer W turns so as to face the heat treatment unit 160. Subsequently, the gate valve 185 opens a space between the treatment chamber 6 and the transfer chamber 170, and the transfer robot 150 transfers the untreated semiconductor wafer W into the treatment chamber 6. At this time, when a preceding heat-treated semiconductor wafer W exists in the treatment chamber 6, the heat-treated semiconductor wafer W is taken out by the lower transfer hand 151*b*, and then an untreated semiconductor wafer W is transferred into the treatment chamber 6 by the upper transfer hand 151*a* to perform an exchange of a wafer. After that, the gate valve 185 closes the space between the treatment chamber 6 and the transfer chamber 170.

The semiconductor wafer W transferred to the treatment chamber 6 is preliminary heated by the halogen lamps HL, and is then subjected to flash heating treatment by irradiation with a flash of light from the flash lamps FL. This flash heating treatment activates impurities.

After the flash heating treatment is finished, the gate valve 185 reopens the space between the treatment chamber 6 and the transfer chamber 170, and then the transfer robot 150 transfers the semiconductor wafer W after the flash heating treatment from the treatment chamber 6 to the transfer chamber 170 with the transfer hand 151*b*. The transfer robot 150 taking out the semiconductor wafer W is turned from the treatment chamber 6 so as to face the first cool chamber 131 or the second cool chamber 141. Then, the gate valve 185 closes the space between the treatment chamber 6 and the transfer chamber 170.

After that, the transfer robot 150 moves forward the transfer hand 151*b* to transfer the heat-treated semiconductor wafer W into the first cool chamber 131 of the cooling unit 130 or the second cool chamber 141 of the cooling unit 140. At this time, when the treated semiconductor wafer W is transferred from the indexer unit 101 to the transfer chamber 170 via the first cool chamber 131, the treated semiconductor wafer W is transferred to the first cool chamber 131. Meanwhile, when a treated semiconductor wafer W is transferred from the indexer unit 101 to the transfer chamber 170 via the second cool chamber 141, the treated semiconductor wafer W is transferred to the second cool chamber 141. That is, the semiconductor wafer W is transferred to the first cool chamber 131 or the second cool chamber 141, through which it has passed in an outward way, also in an inward way.

When an additional untreated semiconductor wafer W exists in the first cool chamber 131 or the second cool chamber 141, the untreated semiconductor wafer W is taken out by the upper transfer hand 151*a*, and then a treated semiconductor wafer W is transferred to the first cool chamber 131 or the second cool chamber 141 by the transfer hand 151*b* to perform an exchange of a wafer.

In the first cool chamber 131 or the second cool chamber 141, cooling treatment is applied to the semiconductor wafer W after the flash heating treatment. The entire semiconductor wafer W has a relatively high temperature when being transferred out from the treatment chamber 6 of the heat treatment unit 160, so that it is cooled to near room temperature in the first cool chamber 131 or the second cool chamber 141. After a predetermined cooling treatment time elapses, the delivery robot 120 transfers out a cooled semiconductor wafer W from the first cool chamber 131 or the second cool chamber 141, and returns it to the carrier C. When a predetermined number of treated semiconductor wafers W is accommodated in the carrier C, the carrier C is transferred out from the load port 110 of the indexer unit 101.

The flash heating treatment in the heat treatment unit 160 will be continuously described. Prior to transfer of a semiconductor wafer W into the treatment chamber 6, not only the valve 84 for supplying air is opened, but also the exhaust valves 89 and 192 are opened, to start supplying and exhausting gas into and from the treatment chamber 6. When the valve 84 is opened, nitrogen gas is supplied into the heat treatment space 65 through the gas supply opening 81. In addition, when the valve 89 is opened, gas in the treatment chamber 6 is exhausted through the gas exhaust opening 86. This causes the nitrogen gas supplied from an upper portion of the heat treatment space 65 of the treatment chamber 6 to flow downwardly and then to be exhausted from a lower portion of the heat treatment space 65.

The gas within the treatment chamber 6 is exhausted also through the transport opening 66 by opening the valve 192. Further, the exhaust mechanism (not shown) exhausts an atmosphere near the drivers of the transfer mechanism 10. When heat treatment is applied to the semiconductor wafer W in the heat treatment unit 160, nitrogen gas is continuously supplied into the heat treatment space 65. The amount of the supply is appropriately changed depending on a treatment step.

Subsequently, the gate valve 185 is opened to open the transport opening 66. The transfer robot 150 transfers a semiconductor wafer W to be treated into the heat treatment space 65 of the treatment chamber 6 through the transport opening 66. The transfer robot 150 moves forward the transfer hand 151*a* to hold the untreated semiconductor wafer W to a position directly above the holder 7 and stops it. Then, the pair of transfer arms 11 of the transfer mechanism 10 is moved horizontally from the retracted position to the transfer operation position and is then moved upward, whereby the lift pins 12 pass through the through holes 79 and protrude from the upper surface of the holding plate 75 of the susceptor 74 to receive the semiconductor wafer W. At this time, the lift pins 12 move upward to the position above the upper ends of the substrate support pins 77.

After the untreated semiconductor wafer W is placed on the lift pins 12, the transfer robot 150 retracts the transfer hand 151a from the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held from below in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof into which impurities are implanted by pattern formation is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is retracted to the retracted position, i.e. to the inside of the recessed portion 62, by the horizontal movement mechanism 13.

The semiconductor wafer W is held from below by the susceptor 74 of the holder 7 in a horizontal attitude, and then the 40 halogen lamps HL light up all together to start preliminary heating (assist heating). Halogen light emitted from the halogen lamps HL is transmitted through the lower chamber window 64 and the susceptor 74 both made of quartz, and impinges upon the lower surface of the semiconductor wafer W. When light irradiation from the halogen lamps HL is received, the semiconductor wafer W is preliminary heated to be increased in temperature. It should be noted that the transfer arms 11 of the transfer mechanism 10, which are retracted to the inside of the recessed portion 62, and thus do not become an obstructacle to the heating using the halogen lamps HL.

The radiation thermometer 20 measures temperature of the semiconductor wafer W when the halogen lamps HL perform the preliminary heating. Specifically, the radiation thermometer 20 receives infrared radiation emitted from the back surface of the semiconductor wafer W held by the susceptor 74 through the opening 78 to measure temperature of the semiconductor wafer W increasing in temperature. The measured temperature of the semiconductor wafer W is transmitted to the controller 3. The controller 3 controls the output from the halogen lamps HL while monitoring whether the temperature of the semiconductor wafer W increasing in temperature by the irradiation with light from the halogen lamps HL reaches a predetermined preliminary heating temperature T1 or not. In other words, the controller 3 effects feedback control of the output from the halogen lamps HL so that the temperature of the semiconductor wafer W is equal to the preliminary heating temperature T1, based on the value measured with the radiation thermometer 20. The preliminary heating temperature T1 is set to about 600° C. to 800° C. (700° C. in the present preferred embodiment) where impurities added to the semiconductor wafer W may not be diffused by heat.

After the temperature of the semiconductor wafer W reaches the preliminary heating temperature T1, the controller 3 maintains the temperature of the semiconductor wafer W at the preliminary heating temperature T1 for a while. Specifically, when the temperature of the semiconductor wafer W measured with the radiation thermometer 20 reaches the preliminary heating temperature T1, the controller 3 controls the output from the halogen lamps HL to maintain the temperature of the semiconductor wafer W at approximately the preliminary heating temperature T1.

When the preliminary heating using the halogen lamps HL as described above is performed, the entire semiconductor wafer W is uniformly increased in temperature to the preliminary heating temperature T1. In the stage of the preliminary heating using the halogen lamps HL, while the semiconductor wafer W shows a tendency to be lower in temperature in a peripheral portion thereof where heat dissipation is liable to occur than in a central portion thereof. However, the halogen lamps HL in the halogen lamp house 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of the preliminary heating.

At the time when a predetermined time elapses after temperature of a semiconductor wafer W reaches a preliminary heating temperature T1, the flash lamps FL irradiate an upper surface of the semiconductor wafer W with a flash of light. At this time, a part of a flash of light emitted from each of the flash lamps FL directly radiates into the treatment chamber 6, and the other thereof radiates into the treatment chamber 6 after being reflected once by the reflector 52, and then flash heating of the semiconductor wafer W is performed by emission of these flashes of light.

The flash heating is performed by emission of a flash of light from each of the flash lamps FL, so that front surface temperature of the semiconductor wafer W can be increased in a short time. In other words, a flash of light emitted from each of the flash lamps FL is an extremely-short and intensive flash acquired by converting electrostatic energy preliminarily accumulated in a capacitor into an extremely short optical pulse of the order of irradiation time of not less than 0.1 milliseconds and not more than 100 milliseconds. Then, upper-surface temperature of the semiconductor wafer W irradiated with a flash of light from each of the flash lamps FL for flash heating momentarily increases to a treatment temperature T2 of 1000° C. or more, and sharply decreases after impurities implanted into the semiconductor wafer W are activated. As described above, the upper-surface temperature of a semiconductor wafer W can be increased and decreased in an extremely short time, so that impurities implanted into the semiconductor wafer W can be activated while diffusion of the impurities is suppressed. A time required for activation of the impurities is extremely short as compared with a time required for thermal diffusion thereof, so that the activation is completed even in a short time of the order of from 0.1 milliseconds to 100 milliseconds, where no diffusion occurs.

After flash heating treatment is finished, the halogen lamps HL each are tuned off after elapse of a predetermined time. This causes the semiconductor wafer W to sharply decrease in temperature from the preliminary heating temperature T1. The radiation thermometer 20 measures the temperature of the semiconductor wafer W decreasing in temperature, and a result of measurement is transmitted to the controller 3. The controller 3 monitors whether the temperature of the semiconductor wafer W is decreased to a predetermined temperature on the basis of the result of measurement with the radiation thermometer 20 or not. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the treated semiconductor wafer W placed on the lift pins 12 is transferred out with the lower transfer hand 151b of the transfer robot 150. The transfer robot 150 moves forward the lower transfer hand 151b to a position just below the semiconductor wafer W pushed up by the lift pins 12 and stops it. Then, as the pair of transfer arms 11 descends, the semiconductor wafer W after the flash heating is delivered to the transfer hand 151b and mounted thereon. After that, the transfer robot 150 retracts the transfer hand 151b from the treatment chamber 6 to transfer out the treated semiconductor wafer W.

In the present preferred embodiment, a semiconductor wafer W that has passed through the first cool chamber 131 of the cooling unit 130 as an untreated substrate is returned to the first cool chamber 131 as a treated substrate after heating treatment in the heat treatment unit 160 and is cooled. Likewise, a semiconductor wafer W that has passed through the second cool chamber 141 of the cooling unit 140 as an untreated substrate is returned to the second cool chamber 141 as a treated substrate after the heat treatment in the heat treatment unit 160 and is cooled.

The transfer robot 150 performs an exchange of a wafer of transferring a treated semiconductor wafer into each of the first cool chamber 131 and the second cool chamber 141 almost at the same time when an untreated semiconductor wafer W is transferred out to the transfer chamber 170 therefrom. The indexer unit 101 where the carrier C is delivered to the outside of the apparatus is exposed to the air atmosphere. When an untreated semiconductor wafer W is transferred from the indexer unit 101 exposed to the air atmosphere to the first cool chamber 131 (or the second cool chamber 141), the ambient atmosphere is mixed in the first cool chamber 131 to sharply increase oxygen concentration. When an exchange of a wafer is performed in this state and a semiconductor wafer W after heating treatment, having a relatively high temperature, is transferred to the first cool chamber 131, the treated semiconductor wafer W may be oxidized.

In the present preferred embodiment, the gas supply unit 250 and the exhaust unit 260 adjust the atmosphere in the first cool chamber 131 in accordance with timing of transfer of a semiconductor wafer W. Atmosphere control in the first cool chamber 131 will be described below. While the following is a description of the atmosphere control in the first cool chamber 131, the same applies to the second cool chamber 141.

Figure 11:
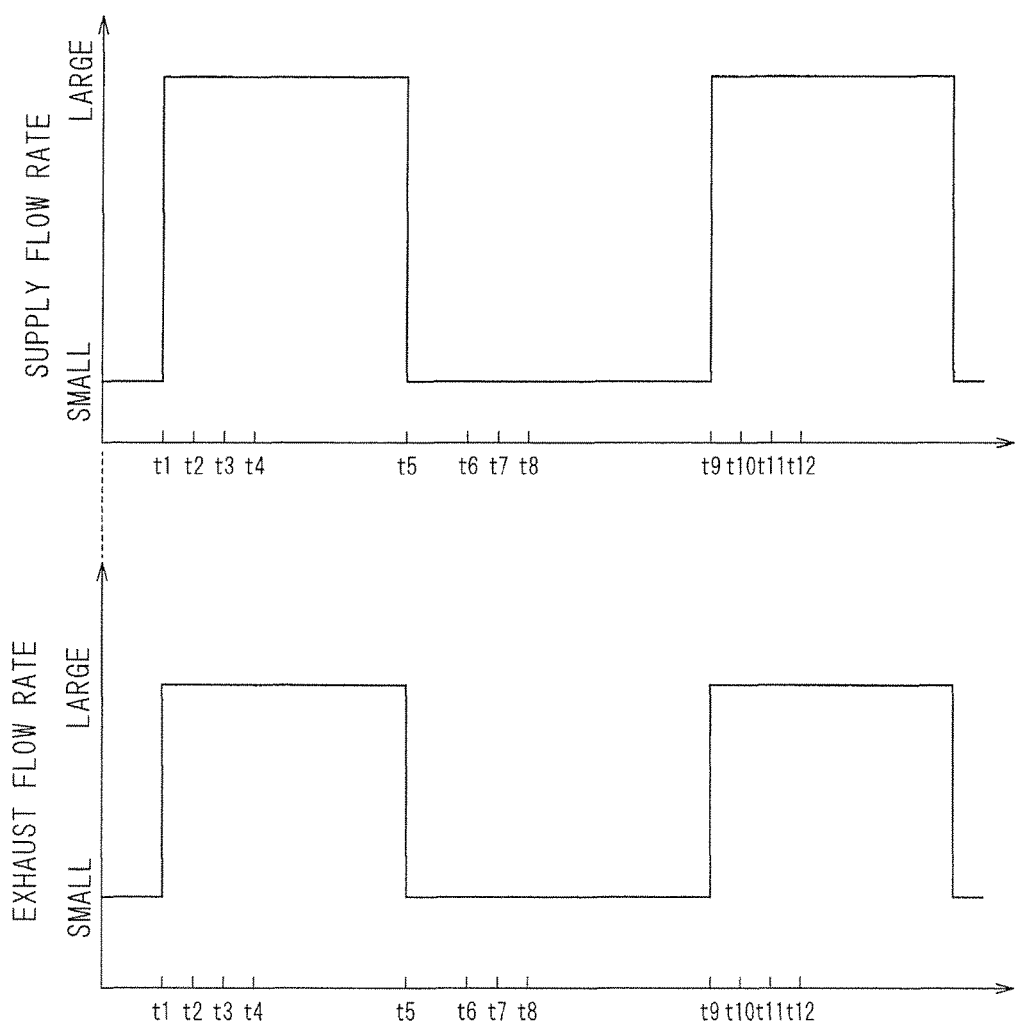
FIG. 11 is a graph showing changes in a supply flow rate of nitrogen gas, and an exhaust flow rate, for the first cool chamber.

FIG. 11 is a graph showing changes in a supply flow rate of nitrogen gas, and an exhaust flow rate, for the first cool chamber 131. The upper part of FIG. 11 shows a supply flow rate of the nitrogen gas to the first cool chamber 131, and the lower part thereof shows an exhaust flow rate from the first cool chamber 131. The supply flow rate of the nitrogen gas to the first cool chamber 131 is switched between a large supply flow rate and a small supply flow rate by the mass flow controller 252. Meanwhile, the exhaust flow rate from the first cool chamber 131 is switched between a large exhaust flow rate and a small exhaust flow rate by opening and closing the main valve 263.

First, at time t1 when a semiconductor wafer W does not exist in the first cool chamber 131, the supply flow rate of the nitrogen gas is set to the large supply flow rate, and the exhaust flow rate is also switched to the large exhaust flow rate. At this time, the gate valve 181 and the gate valve 183 are closed to cause the inside of the first cool chamber 131 to be an enclosed space.

Next, the gate valve 181 is opened at time t2, and an untreated semiconductor wafer W is transferred to the first cool chamber 131 from the indexer unit 101 at subsequent time t3. At this time, the delivery robot 120 transfers the untreated semiconductor wafer W from the indexer unit 101 exposed to the air atmosphere to the first cool chamber 131, so that the air atmosphere is mixed into the first cool chamber 131. However, nitrogen gas is supplied to the first cool chamber 131 at a large supply flow rate, so that the nitrogen gas flows out from an opening of the first cool chamber 131 on an indexer unit 101 side to enable an inflow of air from the indexer unit 101 to be minimized. Nevertheless, mixing of the air atmosphere into the first cool chamber 131 cannot be completely prevented, so that an oxygen concentration in the first cool chamber 131 rises sharply to about several percent.

Subsequently, the gate valve 181 is closed at time t4 to cause the inside of the first cool chamber 131 to be an enclosed space. Nitrogen gas is supplied at a large supply flow rate into the first cool chamber 131 as an enclosed space for a predetermined time (e.g., about one minute) from time t4, and the atmosphere is exhausted from the first cool chamber 131 at a large exhaust flow rate. This causes oxygen mixed in the first cool chamber 131 when a semiconductor wafer W is transferred therein to be quickly discharged from the first cool chamber 131. As a result, the oxygen concentration in the first cool chamber 131, which has increased to about several percent, quickly drops to 1 ppm or less.

When nitrogen gas is supplied into the first cool chamber 131 at a large supply flow rate, pressure in the first cool chamber 131 becomes higher than pressure in the transfer chamber 170. As a result, an atmosphere in the first cool chamber 131 may leak into the transfer chamber 170 and an oxygen concentration in the transfer chamber 170 may rise. While nitrogen gas is supplied to the first cool chamber 131 at a large supply flow rate, the atmosphere is exhausted from the first cool chamber 131 at a large exhaust flow rate to cause pressure in the first cool chamber 131 to be kept lower than pressure in the transfer chamber 170. This prevents the atmosphere in the first cool chamber 131 from leaking to the transfer chamber 170.

After that, at time t5, the supply flow rate of the nitrogen gas to the first cool chamber 131 is switched to the small supply flow rate, and the exhaust flow rate from the first cool chamber 131 is switched to the small exhaust flow rate. When the supply flow rate of the nitrogen gas to the first cool chamber 131 is switched to the small supply flow rate, the pressure in the first cool chamber 131 becomes lower than the atmospheric pressure. As a result, an air atmosphere in the indexer unit 101 may leak into the first cool chamber 131. While the supply flow rate of the nitrogen gas to the first cool chamber 131 is switched to the small supply flow rate, at the same time the exhaust flow rate from the first cool chamber 131 is switched to the small exhaust flow rate. As a result, the pressure in the first cool chamber 131 is kept higher than the atmospheric pressure. This prevents the air atmosphere in the indexer unit 101 from leaking to the first cool chamber 131.

Subsequently, at time t6, the gate valve 183 is opened to cause an internal space of the first cool chamber 131 and an internal space of the transfer chamber 170 to communicate with each other. Then, at subsequent time t7, the transfer robot 150 transfers an untreated semiconductor wafer W from the first cool chamber 131 to the transfer chamber 170, and transfers a preceding treated semiconductor wafer W from the transfer chamber 170 to the first cool chamber 131. That is, the transfer robot 150 exchanges the semiconductor wafer W. The oxygen concentration in the first cool chamber 131 has been lowered to 1 ppm or less before the gate valve 183 is opened at the time t6, so that the oxygen concentration in the transfer chamber 170 is prevented from rising when the semiconductor wafer W is exchanged.

The treated semiconductor wafer W transferred to the first cool chamber 131 is placed on the quartz plate 133 on the cooling plate 132, and is cooled. While the treated semiconductor wafer W has a relatively high temperature at the time of being transferred into the first cool chamber 131, the oxygen concentration in the first cool chamber 131 at the time is reduced to 1 ppm or less to enable the semiconductor wafer W after heating treatment to be prevented from being oxidized.

Subsequently, the gate valve 183 is closed at time t8 to cause the inside of the first cool chamber 131 to be an enclosed space again. Nitrogen gas is supplied at a small supply flow rate into the first cool chamber 131 as an enclosed space for a predetermined time (e.g., about fifty seconds) from time t8, and the atmosphere is exhausted from the first cool chamber 131 at a small exhaust flow rate. As a result, a treated semiconductor wafer W is cooled, and the inside of the first cool chamber 131 is kept at a low oxygen concentration.

After that, at time t9, the supply flow rate of the nitrogen gas to the first cool chamber 131 is switched to the large supply flow rate, and the exhaust flow rate from the first cool chamber 131 is switched to the large exhaust flow rate. While the supply flow rate of the nitrogen gas to the first cool chamber 131 is switched to the large supply flow rate, at the same time the exhaust flow rate from the first cool chamber 131 is switched to the large exhaust flow rate, also at this time. As a result, the pressure in the first cool chamber 131 is kept lower than pressure in the transfer chamber 170 to prevent an atmosphere in the first cool chamber 131 from leaking to the transfer chamber 170.

At time t10, the gate valve 181 is opened to cause the internal space of the first cool chamber 131 and the indexer unit 101 exposed to the air atmosphere to communicate with each other. Then, at time t11, the treated semiconductor wafer W cooled is transferred from the first cool chamber 131 to the indexer unit 101, and subsequently an additional untreated semiconductor wafer W is transferred from the indexer unit 101 into the first cool chamber 131. At this time, an air atmosphere is mixed into the first cool chamber 131 again to sharply increase the oxygen concentration in the first cool chamber 131 to about several percent. After that, at time t12, the gate valve 181 is closed to cause the inside of the first cool chamber 131 to be an enclosed space, and the same procedure as described above is subsequently repeated.

As described above, in the present preferred embodiment, nitrogen gas is supplied into the first cool chamber 131 at a large supply flow rate for a predetermined time after an untreated semiconductor wafer W is transferred into the first cool chamber 131 (or the second cool chamber 141), and exhausting from the first cool chamber 131 is performed at a large exhaust flow rate. This causes the oxygen concentration in the first cool chamber 131, sharply rising when an untreated semiconductor wafer W is transferred, to sharply decrease, so that the oxygen concentration in the first cool chamber 131 sufficiently decreases at the time when a semiconductor wafer W after heating treatment, having a relatively high temperature, is transferred to the first cool chamber 131. As a result, a semiconductor wafer W after heating treatment can be prevented from being oxidized.

When the gate valve 183 is opened to exchange a semiconductor wafer W while a supply flow rate of nitrogen gas to the first cool chamber 131 is kept at a large supply flow rate, an atmosphere in the first cool chamber 131 may flow into the transfer chamber 170. In the present preferred embodiment, before an untreated semiconductor wafer W is transferred from the first cool chamber 131, nitrogen gas is supplied into the first cool chamber 131 at a small supply flow rate, and exhausting from the first cool chamber 131 is performed at a small exhaust flow rate. Thus, it is possible to minimize an inflow of the atmosphere from the first cool chamber 131 when an untreated semiconductor wafer W is transferred from the first cool chamber 131 to the transfer chamber 170. Even when an atmosphere in the first cool chamber 131 slightly flows into the transfer chamber 170 when a semiconductor wafer W is transferred out, an oxygen concentration in the transfer chamber 170 is prevented from increasing due to a sufficiently low oxygen concentration in the first cool chamber 131.

In addition, before a treated semiconductor wafer W cooled is transferred out from the first cool chamber 131, nitrogen gas is again supplied into the first cool chamber 131 at a large supply flow rate, and exhausting from the first cool chamber 131 is performed at a large exhaust flow rate. Thus, when a treated semiconductor wafer W is transferred from the first cool chamber 131, nitrogen gas flows out from the opening of the first cool chamber 131 on the indexer unit 101 side to enable an inflow of air from the indexer unit 101 to be minimized.

From a viewpoint of minimizing an oxygen concentration in the treatment chamber 6 for heating the semiconductor wafer W, it is preferable that pressure in each chamber decrease in the order described below, the treatment chamber 6, the transfer chamber 170, the first cool chamber 131 (or the second cool chamber 141), and atmospheric pressure. This enables minimizing of leakage of an atmosphere from the indexer unit 101, exposed to the air atmosphere, to the treatment chamber 6 via the first cool chamber 131 (or the second cool chamber 141) and the transfer chamber 170.

In the present preferred embodiment, a supply flow rate of nitrogen gas to the first cool chamber 131 is switched to the large supply flow rate and at the same time when an exhaust flow rate from the first cool chamber 131 is switched to the large exhaust flow rate, so that pressure in the first cool chamber 131 is always kept lower than pressure in the transfer chamber 170. Conversely, a supply flow rate of nitrogen gas to the first cool chamber 131 is switched to the small supply flow rate and at the same time when an exhaust flow rate from the first cool chamber 131 is switched to the small exhaust flow rate, so that pressure in the first cool chamber 131 is always kept higher than the atmospheric pressure. That is, pressure in the first cool chamber 131 is kept lower than pressure in the transfer chamber 170 as well as higher than the atmospheric pressure.

While the preferred embodiment according to the present invention has been described above, various modifications of the present invention in addition to it described above may be made without departing from the scope and spirit of the invention. For example, an automatic pressure control (APC) valve may be provided in each of the main exhaust pipe 261a and the auxiliary exhaust pipe 261b of the exhaust unit 260 to keep pressure in the first cool chamber 131 constant. Besides this, an exhaust system of the transfer chamber 170 may be provided with an automatic pressure control valve for keeping pressure in the transfer chamber 170 constant. This enables pressure in the first cool chamber 131 to be reliably kept lower than pressure in the transfer chamber 170 and higher than the atmospheric pressure.

In the above preferred embodiment, while a supply flow rate of nitrogen gas to the first cool chamber 131 is switched between two stages of the large supply flow rate and the small supply flow rate by the mass flow controller 252, the supply flow rate is not limited to two stages, and thus may be switched among multiple stages such as three or more stages. Likewise, an exhaust flow rate from the first cool chamber 131 may be switched among multiple stages such as three or more stages.

In addition, a supply flow rate of nitrogen gas to the first cool chamber 131 and an exhaust flow rate from the first cool chamber 131 may be controlled on the basis of a measurement result of an oxygen concentration by the oxygen concentration meter 135 (with reference to FIG. 10) provided in the first cool chamber 131.

In addition, the auxiliary valve 262 is not necessarily provided in the auxiliary exhaust pipe 261b if it is open all the time.

In the above preferred embodiment, while preliminary heating of a semiconductor wafer W is performed by light irradiation from halogen lamps HL, instead of this a susceptor holding a semiconductor wafer W may be mounted on a hot plate to preliminary heat the semiconductor wafer W by heat conduction from the hot plate.

While the 30 flash lamps FL are provided in the flash lamp house 5 in the above preferred embodiment, the present invention is not limited to this, and any number of flash lamps FL may be provided. The flash lamps FL are not limited to the xenon flash lamps, and may be krypton flash lamps. The number of halogen lamps HL provided in the halogen lamp house 4 is also not limited to 40, and any number of halogen lamps HL may be provided.

In the above preferred embodiment, while the filament-type halogen lamps HL each are used as a continuous lighting lamp that emits light continuously for not less than one second to preliminarily heat the semiconductor wafer W, the present invention is not limited to this, an arc lamp of a discharge type may be used as a continuous lighting lamp in place of the halogen lamp HL to perform preliminary heating.

A substrate to be treated by the heat treatment apparatus 100 is not limited to a semiconductor wafer, and may be a glass substrate to be used for a flat panel display such as a liquid crystal display device, and a substrate for a solar battery. The art according to the present invention may be applicable for heat treatment for a high-permittivity gate insulating film (High-k film), joining between metal and silicon, and crystallization of polysilicon.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method for irradiating a substrate with light to heat the substrate, the heat treatment method comprising the steps of:
    (a) transferring an untreated substrate from an indexer unit exposed to the air atmosphere to a cooling chamber connected to said indexer unit through a first gate valve;
    (b) transferring out said untreated substrate from said cooling chamber to a transfer chamber connected to said cooling chamber through a second gate valve;
    (c) transferring said untreated substrate from said transfer chamber to a treatment chamber connected to said transfer chamber;
    (d) applying heating treatment to said untreated substrate in said treatment chamber;
    (e) transferring a treated substrate subjected to heating treatment in said treatment chamber to said cooling chamber via said transfer chamber;
    (f) cooling said treated substrate in said cooling chamber; and
    (g) transferring out said treated substrate cooled in said cooling chamber from said cooling chamber to said indexer unit,
    wherein nitrogen gas is supplied to said cooling chamber at a first supply flow rate or a second supply flow rate larger than said first supply flow rate,
    an atmosphere is exhausted from said cooling chamber at a first exhaust flow rate or a second exhaust flow rate larger than said first exhaust flow rate, and
    for at least a predetermined time after said untreated substrate is transferred to said cooling chamber, nitrogen gas is supplied to said cooling chamber at said second supply flow rate and exhausting from the cooling chamber is performed at said second exhaust flow rate.

2. The heat treatment method according to claim 1, wherein
    before said untreated substrate is transferred out from said cooling chamber, nitrogen gas is supplied to said cooling chamber at said first supply flow rate, and exhausting from said cooling chamber is performed at said first exhaust flow rate.

3. The heat treatment method according to claim 1, wherein
    before said treated substrate is transferred out from said cooling chamber, nitrogen gas is supplied to said cooling chamber at said second supply flow rate, and exhausting from said cooling chamber is performed at said second exhaust flow rate.

4. The heat treatment method according to claim 1, wherein
    pressure in said cooling chamber is kept lower than pressure in said transfer chamber as well as higher than the atmospheric pressure.

5. A heat treatment apparatus for irradiating a substrate with light to heat the substrate, the heat treatment apparatus comprising:
    an indexer unit exposed to the air atmosphere;
    a cooling chamber connected to said indexer unit via a first gate valve, for cooling a substrate;
    a transfer chamber connected to said cooling chamber via a second gate valve;
    a treatment chamber connected to said transfer chamber for applying heating treatment to a substrate;
    a gas supply unit that supplies nitrogen gas to said cooling chamber at a first supply flow rate or a second supply flow rate larger than said first supply flow rate;
    an exhaust unit that exhausts an atmosphere from said cooling chamber at a first exhaust flow rate or a second exhaust flow rate larger than said first exhaust flow rate; and
    a controller for controlling a supply flow rate by said gas supply unit and an exhaust flow rate by said exhaust unit,
    wherein an untreated substrate is transferred from said indexer unit to said treatment chamber via said cooling chamber and said transfer chamber in this order, a treated substrate subjected to heating treatment in said treatment chamber is transferred from said treatment chamber to said indexer unit via said transfer chamber and said cooling chamber in this order, and said controller is configured to control said gas supply unit and said exhaust unit so as to supply nitrogen gas to said cooling chamber at said second supply flow rate and to perform exhausting from said cooling chamber at said second exhaust flow rate, respectively, for at least a predetermined time after said untreated substrate is transferred to said cooling chamber.

6. The heat treatment apparatus according to claim 5, wherein said controller is configured to control said gas supply unit and said exhaust unit so as to supply nitrogen gas to said cooling chamber at said first supply flow rate and to perform exhausting from said cooling chamber at said first exhaust flow rate, respectively, before said untreated substrate is transferred out from said cooling chamber.

7. The heat treatment apparatus according to claim 5, wherein said controller is configured to control said gas supply unit and said exhaust unit so as to supply nitrogen gas to said cooling chamber at said second supply flow rate and to perform exhausting from said cooling chamber at said second exhaust flow rate, respectively, before said treated substrate is transferred out from said cooling chamber.

8. The heat treatment apparatus according to claim 5, wherein pressure in said cooling chamber is kept lower than pressure in said transfer chamber as well as higher than the atmospheric pressure.

* * * * *